United States Patent
Dangler et al.

(10) Patent No.: US 11,641,717 B2
(45) Date of Patent: May 2, 2023

(54) SOLDERING OF END CHIP COMPONENTS IN SERIES

(71) Applicant: INTERNATIONAL BUSINESS MACHINES CORPORATION, Armonk, NY (US)

(72) Inventors: John R. Dangler, Rochester, MN (US); Theron Lee Lewis, Rochester, MN (US); David J. Braun, St. Charles, MN (US); Eric Nguyen Phan, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/446,353

(22) Filed: Aug. 30, 2021

(65) Prior Publication Data
US 2023/0061076 A1    Mar. 2, 2023

(51) Int. Cl.
*B23K 1/00* (2006.01)
*H05K 3/34* (2006.01)
*B23K 37/04* (2006.01)
*B23K 101/42* (2006.01)

(52) U.S. Cl.
CPC ............. *H05K 3/34* (2013.01); *B23K 1/0016* (2013.01); *B23K 37/04* (2013.01); *B23K 2101/42* (2018.08)

(58) Field of Classification Search
CPC .......... B23K 1/0016; B23K 37/04; B23K 2101/36–42; B23K 1/018; H05K 3/34
(Continued)

(56) References Cited

U.S. PATENT DOCUMENTS 5,184,284 A    2/1993  Ashelin
5,838,070 A *  11/1998 Naruse ................... H05K 1/111
                                                  361/768
(Continued)

FOREIGN PATENT DOCUMENTS

CN         1201364 A  * 12/1998  ........... B23K 1/0056
CN     103489631 B   * 12/2016  ............. H01G 4/232
(Continued)

OTHER PUBLICATIONS

CIPC, "Acceptability of Electronic Assemblies", IPC-A-610G, Developed by the IPC-A-610 Task Group (7-31b) of the Acceptability Subcommittee (7-31) of the Product Assurance Committee (7-30) of IPC, Feb. 2016, pp. 1-9.
(Continued)

*Primary Examiner* — Kiley S Stoner
(74) *Attorney, Agent, or Firm* — Tihon Poltavets

(57) ABSTRACT

A method for printed circuit board design rework utilizing two components in series, the method includes selecting a first chip component and a second chip component for placement on an original land location previously occupied by an original chip component. The method further includes placing the first chip component and the second chip component on a chip component support structure. The method further includes soldering a first end of the first chip component to a first end of the second chip component. Responsive to transferring the first chip component and the second chip component to the original land location, the method further includes soldering a second end of the first chip component to a first land of the original land location. The method further includes soldering a second end of the second chip component to a second land of the original land location.

17 Claims, 7 Drawing Sheets

(58) Field of Classification Search
USPC .............. 228/119, 191, 264, 179.1–180.22
See application file for complete search history.

(56) References Cited

U.S. PATENT DOCUMENTS

| | | | |
|---|---|---|---|
| 6,373,714 | B1 | 4/2002 | Kudoh |
| 6,716,673 | B2 | 4/2004 | Waitl |
| 7,084,353 | B1 * | 8/2006 | Downes .............. H05K 3/3442 |
| | | | 174/262 |
| 8,218,330 | B2 | 7/2012 | Bang |
| 2004/0252009 | A1 * | 12/2004 | Tsukada .............. H01C 17/006 |
| | | | 338/203 |
| 2009/0085203 | A1 * | 4/2009 | Weissbach .............. H01L 24/98 |
| | | | 257/737 |
| 2015/0264808 | A1 | 9/2015 | Bretschneider |

FOREIGN PATENT DOCUMENTS

| | | | |
|---|---|---|---|
| CN | 114145080 A | * | 3/2022 |
| JP | 02309601 A | | 12/1990 |
| JP | 0582936 A | | 4/1993 |
| JP | H05121868 A | * | 5/1993 |
| JP | 0766543 A | | 3/1995 |
| JP | H08250848 A | * | 9/1996 |
| JP | 2015103760 A | * | 6/2015 |

OTHER PUBLICATIONS https://www.coilgun.info/theorycapacitors/capacitors2.htm, "Practical Coilgun Design-Parallel and Serial Capacitors", accessed Apr. 27, 2021, pp. 1-3.

* cited by examiner

SOLDERING OF END CHIP COMPONENTS IN SERIES

BACKGROUND

This disclosure relates generally to printed circuit board design rework, and in particular, to soldering of end chip components in series for print circuit board design rework.

A circuit card assembly is typically a printed circuit board utilizing surface-mount technology (SMT) and through-hole technology to attach various electronic components to the printed circuit board. Situations can arise where a design of the printed circuit board of the circuit card assembly requires alteration. A circuit design may require an alternation in resistance, current, voltage and/or capacitance. To avoid scrapping the circuit card assembly and prior to the printed circuit board design rework being complete, different assembly lines are contracted to do printed circuit board design rework by stacking SMT components, disconnecting various traces, and adding jumper wires. Current printed circuit board design rework utilizes the addition of jumper wires, adhesive, and the direct attachment of a single side of the chip component to the printed circuit board surface. This type of design rework typically does not stay within an area of an original discrete location.

SUMMARY

A first aspect of an embodiment of the present invention discloses a method for printed circuit board design rework, the method comprising selecting a first chip component and a second chip component for placement on an original land location previously occupied by an original chip component. The method further comprises placing the first chip component and the second chip component on a chip component support structure. The method further comprises soldering a first end of the first chip component to a first end of the second chip component. The method further comprises, responsive to transferring the first chip component and the second chip component to the original land location, soldering a second end of the first chip component to a first land of the original land location. The method further comprises soldering a second end of the second chip component to a second land of the original land location, wherein the first chip component, the second chip component, and the original land location are in a triangular orientation.

A second aspect of an embodiment of the present invention discloses another method for printed circuit board design rework, the method comprising selecting a first chip component and a second chip component for placement on an original land location previously occupied by an original chip component. The method further comprises, responsive to holding the first chip component at a first designated angle at a first land of the original land location, soldering the first chip component to the first land. The method further comprises, responsive to holding the second chip component at a second designated angle at a second land of the original land location, soldering the second chip component to the second land. The method further comprises soldering the first chip component to the second chip component at a peak formed by the first chip component and the second chip component at the original land location.

A third aspect of an embodiment of the present invention discloses an apparatus for printed circuit board design rework, the apparatus comprising a first chip component, a second chip component, and an original land location, wherein the original land location incudes a first land and a second land for mounting an original chip component. The apparatus further comprises a first end of the first chip component electrically and mechanically coupled to a first end of the second chip component. The apparatus further comprises a second end of the first chip component electrically and mechanically coupled to the first land. The apparatus further comprises a second end of the second chip component electrically and mechanically coupled to the second land, wherein the first chip component and the second chip component are position in a standing triangular position on the first lead and the second lead.

BRIEF DESCRIPTION OF THE SEVERAL VIEWS OF THE DRAWINGS

The following detailed description, given by way of example and not intended to limit the disclosure solely thereto, will best be appreciated in conjunction with the accompanying drawings, in which.

DETAILED DESCRIPTION

Figure 1:
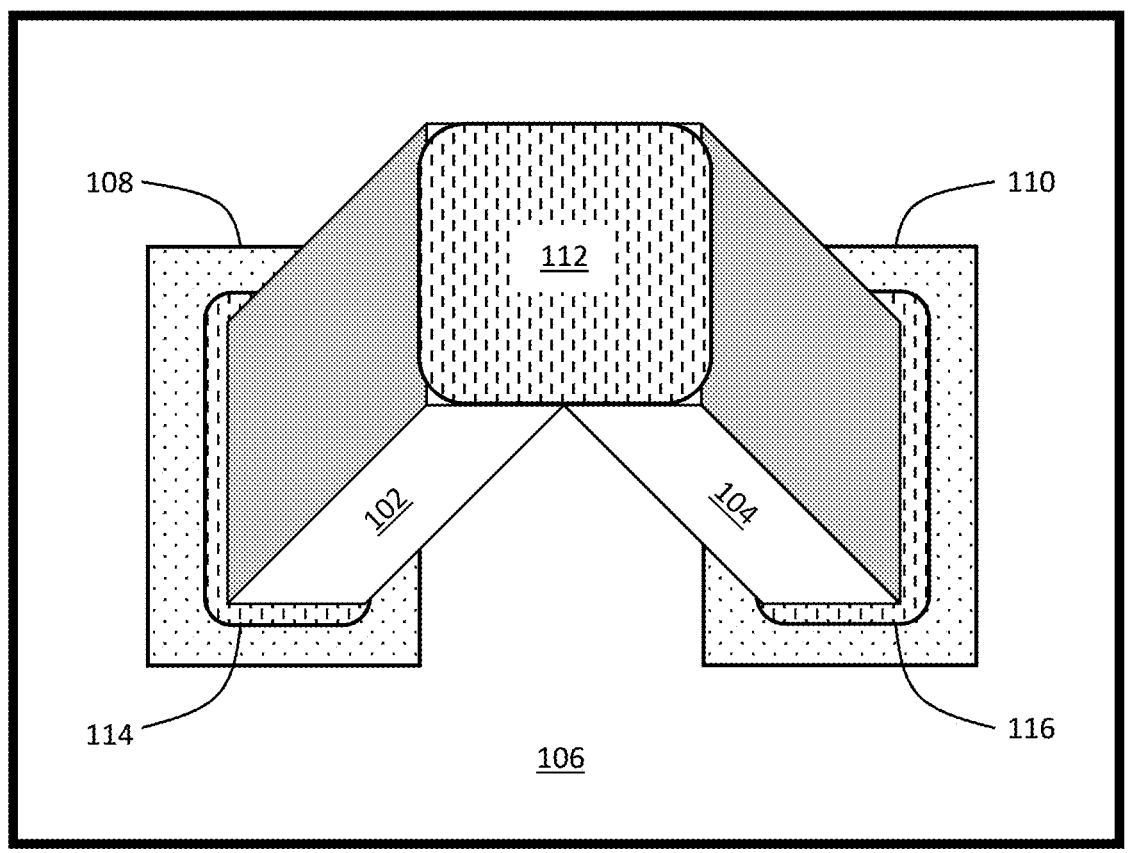
FIG. 1 depicts a top view of two chip components in series utilizing an original land location on a printed circuit board, in accordance with an embodiment of the present invention.

Embodiments of the present invention provides printed circuit board design rework with two chip components in series utilizing an original land location on a printed circuit board. For circuit card assemblies, there are instances when a printed circuit board design needs to be changed (i.e., rework). A circuit design may need to have an alteration in resistance, current, voltage, and/or capacitance. To avoid scrapping the circuit card assembly and prior to a new printed circuit board design being implemented, different assembly lines are contracted to perform printed circuit board design rework by stacking surface mount technology (SMT) components, disconnecting various traces, and adding jumper wires. A common printed circuit board design rework includes placing rectangular or square end chip components in series. Typical attempts to perform the printed circuit board design rework includes utilizing jumper wires, adhesive, and direct attachment to one side of the chip component to the printed circuit board surface, where the rework exceeds the area (i.e., land) of an original discrete location. Embodiments of the present invention allow for the placements of two chip components in series, while maintaining the original discrete location on the printed circuit board.

For the printed circuit board design rework where the chip components are resistors, utilizing two chip components in series allows for a doubling and a dramatic increase in resistance of a circuit. For printed circuit board design rework where the chip components are capacitors, utilizing two chip components in series allows for a reduction in capacitance while increasing an amount of voltage the circuit can handle. Embodiments of the present invention includes a first chip component electrically coupled in series to a second chip component in a triangular orientation on a top surface of a printed circuit board, where the first chip component is electrically coupled to a first land location on the top surface of the printed circuit board and the second chip component is electrically coupled to a second land location on the top surface of the printed circuit board. The two chip components would ideally be of similar dimensions when performing the printed circuit board design rework to ensure a symmetrical orientation between the first land and the second land, but a mismatch of dimensions between the two-chip component can also provide the series structure required.

To position the two chip components in series between the two lands on the printed circuit board, the two chip components are electrically and mechanically coupled in series with soldered prior to transferring the two chip components to the printed circuit board. To electrically and mechanically couple the two chip components in series prior to transferring the two chip components to the printed circuit board, the two chip components are held utilizing one or more of: an e-glass fixture, a vacuum holder, mechanical grippers, removable glue, and manually by hand. Furthermore, the electrically and mechanically coupling of the two chip components in series can be automated in a mass production setting. For manual and/or low frequency situation, a similar solder can be utilized to electrically and mechanically couple the two chip components in series to the two lands on the printed circuit board, as was utilized to join the two chip components. If a mass production process is required to merge components prior to placement on the printed circuit board, a higher melt solder is utilized to attach the two components to one another and a lower melt solder is utilized to attach the two components to the printed circuit board. To provide strain relief to solder joints, an adhesive can be applied to the two components subsequent to electrically and mechanically coupling to the printed circuit board.

Embodiments of the present invention allow for the development of specific resistance, capacitance, and/or voltages in the printed circuit board design rework. Specifically for capacitance, allowing for additional capacitors to be in series lowers an overall capacitance but results in a larger amount of voltage to exist in the circuit increasing operational safety. Furthermore, the additional capacitors in series results in tighter tolerances. Embodiments of the present invention also for the jumping over of bare traces on the printed circuit board, with minimal concerns of causing shorts and an increased ease of inspection. Though the printed circuit board design rework with two chip components in series utilizing an original land location on a printed circuit board relates to a direct application on the printed circuit board, the two chip components in series can be extended to soldering the two chip components on top (i.e., stacking) of another chip component and/or device. The two chip components can utilize a first lead and a second lead of the other chip component and/or device.

Detailed embodiments of the present invention are disclosed herein with reference to the accompanying drawings; however, it is to be understood that the disclosed embodiments are merely illustrative of potential embodiments of the invention and may take various forms. In addition, each of the examples given in connection with the various embodiments is also intended to be illustrative, and not restrictive. This description is intended to be interpreted merely as a representative basis for teaching one skilled in the art to variously employ the various aspects of the present disclosure. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements. The term substantially, or substantially similar, refer to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

FIG. 1 depicts a top view of two chip components in series utilizing an original land location on a printed circuit board, in accordance with an embodiment of the present invention. In this embodiment, printed circuit board design rework 100 includes first chip component 102 in series with second chip component 104 utilizing an original land on printed circuit board 106. An original land on printed circuit board 106 includes first land 108 and second land 110, where a single chip component was positioned between first land 108 and second land 110 prior to a design rework. To perform the design rework, first chip component 102 and second chip component 104 were placed in series at the original land on printed circuit board 106 in a standing triangular orientation. A first end of first chip component 102 is electrically and mechanically coupled to a first end of second chip component 104 via solder joint 112. Solder joint 112 represents a first fusible metal alloy utilized to create a permanent bond between metal workpieces, where in this embodiment the metal workpieces are the first end of first chip component 102 and the first end of second chip component 104.

A second end of first chip component 102 is electrically and mechanically coupled to first land 108 via first solder land joint 114. A second end of second chip component 104 is electrically and mechanically coupled to second land 110 via second solder land joint 116. Similar to solder joint 112, first solder land joint 114 and second solder land joint 116 represent a second fusible metal alloy utilized to create a permanent bond between metal workpieces. In a mass production setting, the second fusible metal alloy of first solder land joint 114 and second solder land joint 116 would have a lower melting point than the first fusible metal alloy of solder joint 112. However, in the illustrated embodiment, the second fusible metal alloy of first solder land joint 114 and second solder land joint 116 has an equal melting point compared to the first fusible metal alloy of solder joint 112 (i.e., same solder type).

Figure 2:
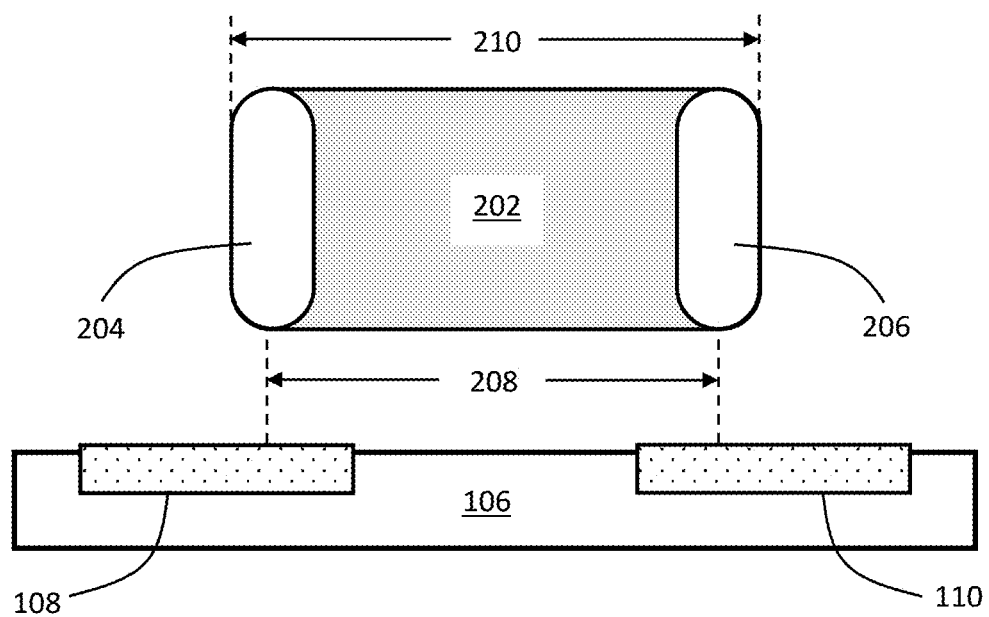
FIG. 2 depicts a side view for placement of a single chip component utilizing an original land location on a printed circuit board, in accordance with an embodiment of the present invention.

FIG. 2 depicts a side view for placement of a single chip component utilizing an original land location on a printed circuit board, in accordance with an embodiment of the present invention. In this embodiment, printed circuit board 106 includes first land 108 and second land 110 with original chip component 202 that previously occupied an original land, prior to the design rework as described above in FIG. 1. First end 204 of original chip component 202 corresponds to first land 108 and second end 206 of original chip component 202 corresponds to second land 110, where end distance 208 represents a distance between first end 204 and second end 206 of original chip component 202. Overall distance 210 represents an overall length for original chip component 202, where both end distance 208 and overall distance 210 are utilized for a selection of a support structure described in detail with regards to FIG. 3. In one embodiment, it is determined that original chip component 202 does not provide a required resistance of at 2X ohms, where original chip component 202 provides only X ohms of resistance. Based on a distance between first land 108 and second land 110 on printed circuit board 106, replacing original chip component 202 with X ohm resistance with another chip component with 2X ohm resistance is not possible due to the larger dimensions of the other chip component with 2X ohm resistance exceeding first land 108 and second land 110. However, utilizing the two chip components (i.e., two original chip components 202) in series in a standing triangular orientation allows for the 2X ohm resistance required for the circuit, while remaining in the bounds of first land 108 and second land 110 on printed circuit board 106.

In another embodiment, it is determined that original chip component 202 provides an excess of capacitance and lower voltage than what is required for the circuit, where original chip component 202 provides 2X micro-Farads of capacitance. Based on a distance between first land 108 and second land 110 on printed circuit board 106, replacing original chip component 202 with 2X micro-Farads of capacitance with another chip component with X micro-Farads of capacitance is not possible due to the dimensions of the other chip component with X micro-Farads. However, utilizing the two chip components (i.e., two original chip components 202) in series in a standing triangular orientation allows for the X micro-Farads of capacitance required for the circuit, while remaining in the bounds of first land 108 and second land 110 on printed circuit board 106. For example, if original chip component 202 has a capacitance of 10.2 micro-Farads, utilizing two original components 202 in a standing triangular orientation achieves a new total capacitance of 5.1 micro-Farads and an increased voltage through the circuit.

Figure 3:
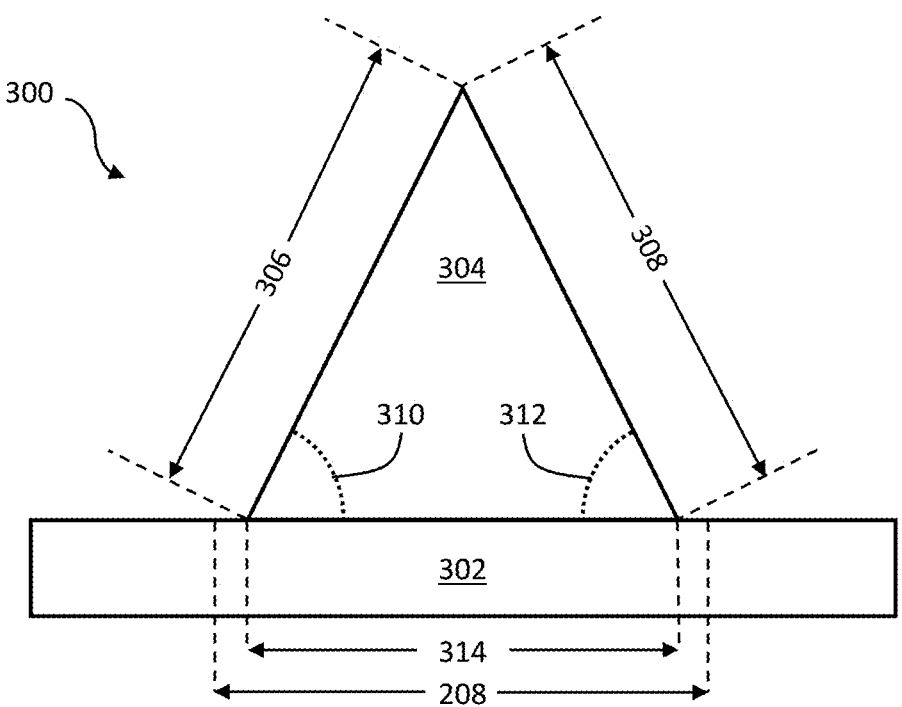
FIG. 3 depicts a side view of a chip component support structure for creation of two chip components in series for an original land location on a printed circuit board, in accordance with an embodiment of the present invention.

FIG. 3 depicts a side view of a chip component support structure for creation of two chip components in series for an original land location on a printed circuit board, in accordance with an embodiment of the present invention. In this embodiment, chip component support structure 300 corresponds to first land 108 and second land 110 on printed circuit board 106 from FIGS. 1 and 2. Chip component support structure 300 includes base 302 and chip component holder 304, where chip component holder 304 is an isosceles triangle for supporting two chip components of equal and/or similar length values. Length 306 is equal to length 308 of chip component holder 304 to form the isosceles triangle, where angle 310 is equal to angle 312. A base of chip component holder 304 is equal to base distance 314 to ensure the two chip components positioned on chip component support structure 300 align with first land 108 and second land 110 separated by end distance 208 on printed circuit board 106 of FIG. 2. In another embodiment, chip component holder 304 is a scalene triangle with no equal sides, where length 306, length 308, and end distance 208 are all different length values. The scalene triangle is utilized when the two chip components being solder into series are of different lengths.

Figure 4:
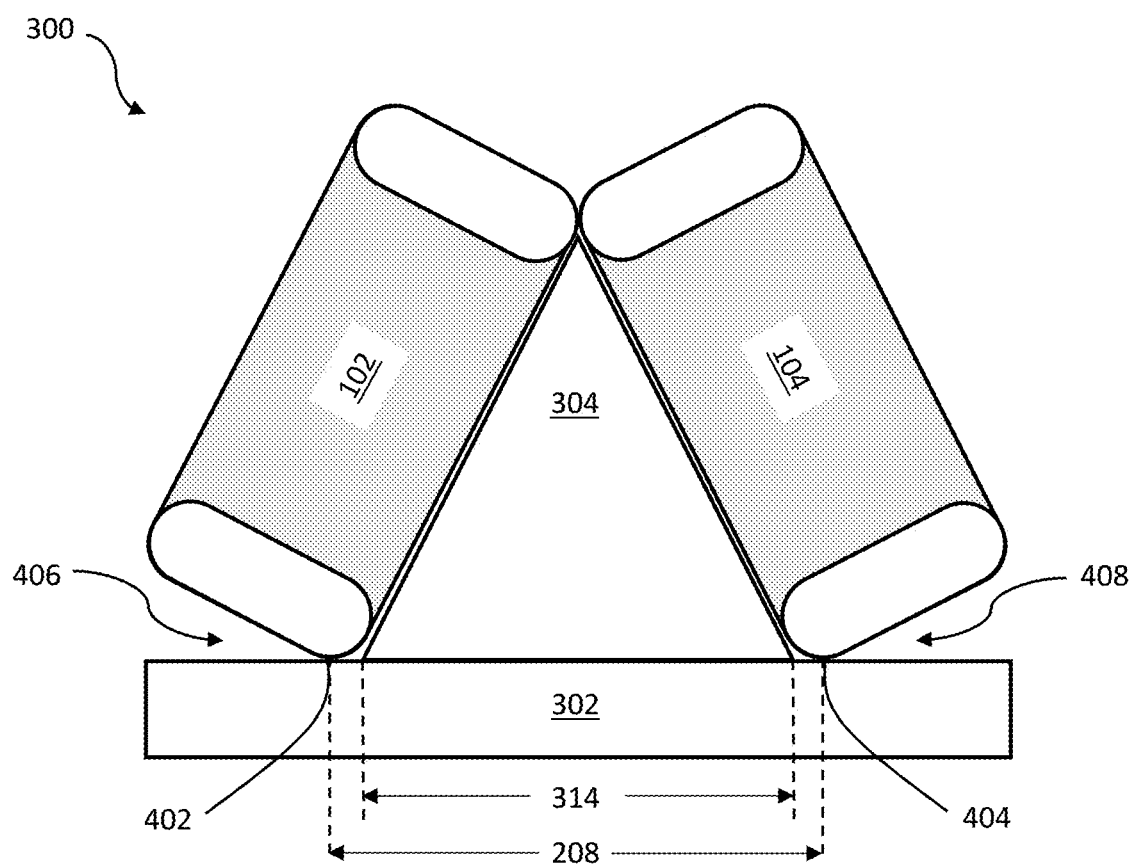
FIG. 4 depicts a side view of a chip component support structure with two chip components prior to soldering, in accordance with an embodiment of the present invention.

FIG. 4 depicts a side view of a chip component support structure with two chip components prior to soldering, in accordance with an embodiment of the present invention. In this embodiment, first chip component 102 and second chip component 104 are placed on chip component holder 304, where a first end of first chip component 102 is to be solder to a first end of second chip component 104 at a peak of chip component holder 304. A second end of first chip component 102 rests on base 302 at point 402 and a second end of second chip component 104 rests on base 302 at point 404, where point 402 and point 404 are separated by end distance 208. As previously discussed in FIG. 2, end distance 208 represents the distance between first land 108 and second land 110 to which original chip component 202 was electrically and mechanically coupled to. Base distance 314 is of a length such when first chip component 102 and second chip component 104 are places on chip component holder 304, a distance between the second end of first chip component 102 and the second of second chip component 104 is equal to end distance 208. Various chip component support structures 300 can correspond to various end distances 208 separating first land 108 and second land 110 and various lengths of first chip component 102 and second chip component 104. In some embodiments, chip component holder 304 is removable and interchangeable from base 302, where various chip component holders 304 of varying dimensions are attachable and removeable from base 302 of chip component support structure 300.

To ensure first chip component 102 and second chip component 104 are temporarily secured on chip component holder 304 prior to solder being applied to the peak to electrically and mechanically couple the first end of first chip component 102 and to the first end of second chip component 104, insertable wedges can be utilized as further support. A first wedge can be inserted at area 406 between the second end of first chip component 102 and a top surface of base 302 of chip component support structure 300. A second wedge can be inserted at area 408 between the second end of second chip component 104 and the top surface of base 302 of chip component support structure 300. In other embodiments, one or more of: an e-glass fixture, a vacuum holder, mechanical grippers, removable glue, and manually by hand, can be utilized to temporarily support first chip component 102 and second chip component 104 in the standup triangular orientation prior to solder being applied to the peak to electrically and mechanically couple the first end of first chip component 102 and to the first end second chip component 104.

Figure 5:
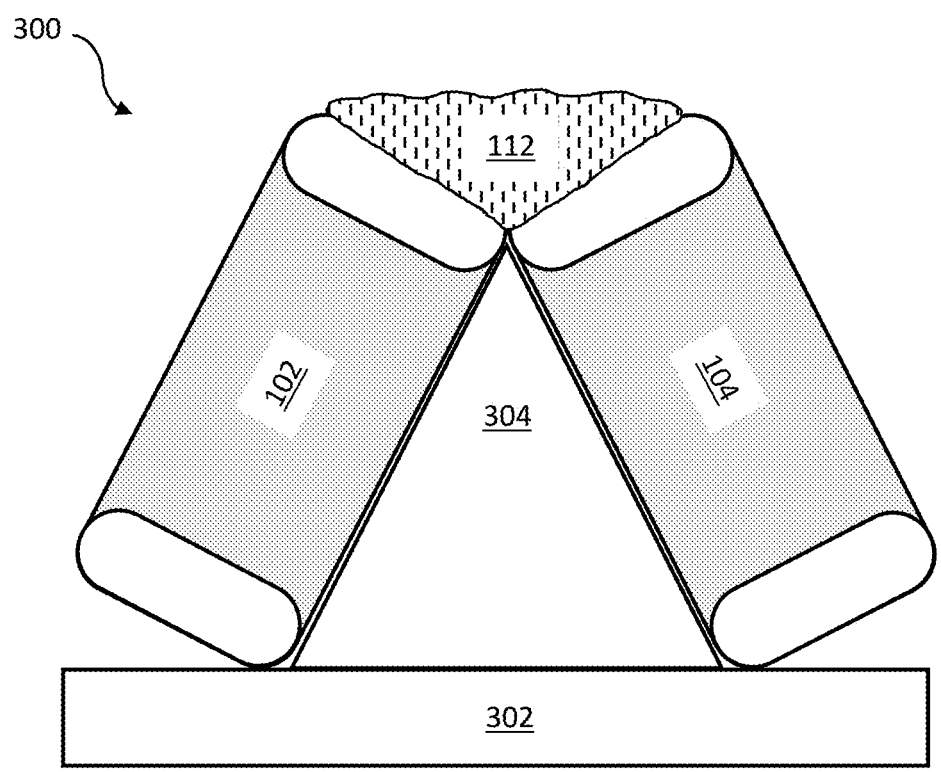
FIG. 5 depicts a side view of a chip component support structure with two chip components with a soldered peak, in accordance with an embodiment of the present invention.

FIG. 5 depicts a side view of a chip component support structure with two chip components with a soldered peak, in accordance with an embodiment of the present invention. As first chip component 102 and second chip component 104 temporarily rest on base 302 and chip component holder 304 of chip component support structure 300, solder joint 112 is created by applying solder to the peak to electrically and mechanically couple the first end of first chip component 102 and to the first end second chip component 104. An amount of solder applied to the peak is such that solder does not seep past the first end of first chip component 102 and the first end of second chip component 104, onto chip component holder 304. Solder joint 112 is such that first chip component 102 is structurally connected to second chip component 104 and removable from base 302 and chip component holder 304 of chip component support structure 300.

Figure 6:
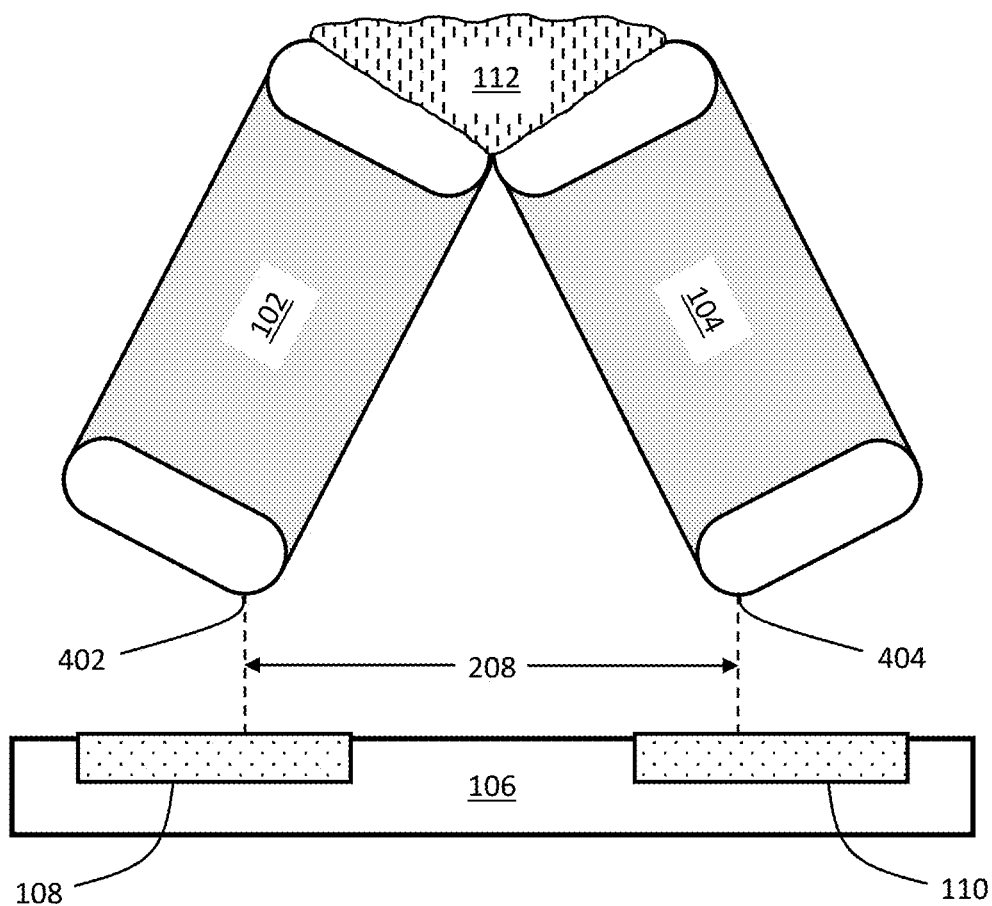
FIG. 6 depicts a side view of two chip components with a soldered peak prior to placement on an original land location on a printed circuit board, in accordance with an embodiment of the present invention.

FIG. 6 depicts a side view of two chip components with a soldered peak prior to placement on an original land location on a printed circuit board, in accordance with an embodiment of the present invention. As first chip component 102 and second chip component 104 are transferred to first land 108 and second land 110 on printed circuit board 106, a second end of first chip component 102 is positioned above first land 108 and a second end of second chip component 104 is positioned above second land 110. End distance 208 between the second end of first chip component 102 and the second end of second chip component 104 is maintained due to solder joint 112 providing mechanical support to maintain an angular orientation between first chip component 102 and second chip component 104. Where point 402 of first chip component 102 previously contacted base 302 of chip component support structure 300, point 402 is to contact first land 108 on printed circuit board 106. Where point 404 of second chip component 104 previously contacted base 302 of chip component support structure 300, point 404 is to contact second land 110 on printed circuit board 106.

Figure 7:
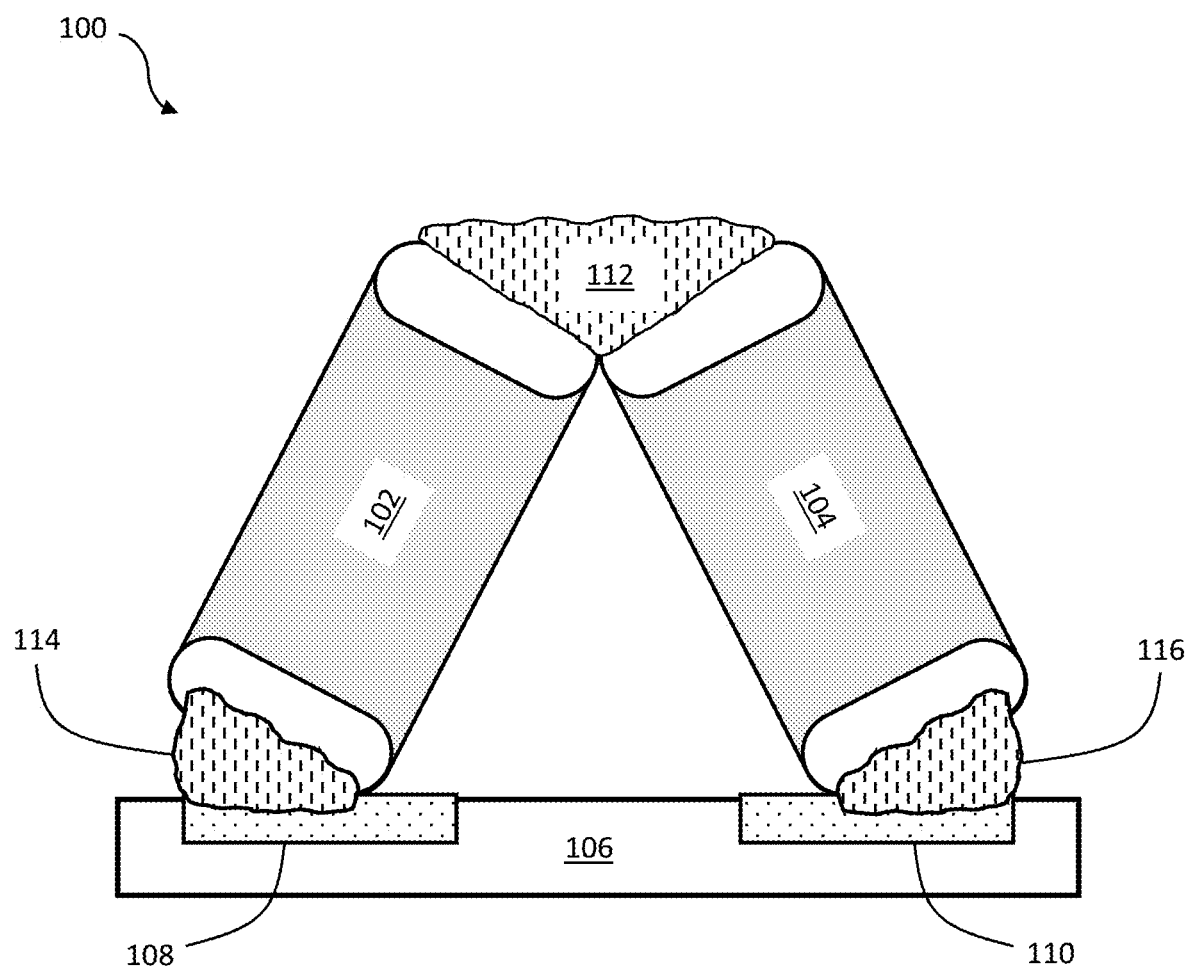
FIG. 7 depicts a side view of two chip components in series soldered to an original land location on a printed circuit board, in accordance with an embodiment of the present invention.

FIG. 7 depicts a side view of two chip components in series soldered to an original land location on a printed circuit board, in accordance with an embodiment of the present invention. In this embodiment, printed circuit board design rework 100 includes first chip component 102 in series with second chip component 104 utilizing an original land on printed circuit board 106. As previously discussed, an original land on printed circuit board 106 includes first land 108 and second land 110, where a single chip component (i.e., original chip component 202) was positioned between first land 108 and second land 110 prior to a design rework. To perform the design rework, first chip component 102 and second chip component 104 were placed in series at the original land on printed circuit board 106 in a standing triangular orientation. A first end of first chip component 102 is electrically and mechanically coupled to a first end of second chip component 104 via solder joint 112. A second end of first chip component 102 is electrically and mechanically coupled to first land 108 via first solder land joint 114. A second end of second chip component 104 is electrically and mechanically coupled to second land 110 via second solder land joint 116.

Figure 8:
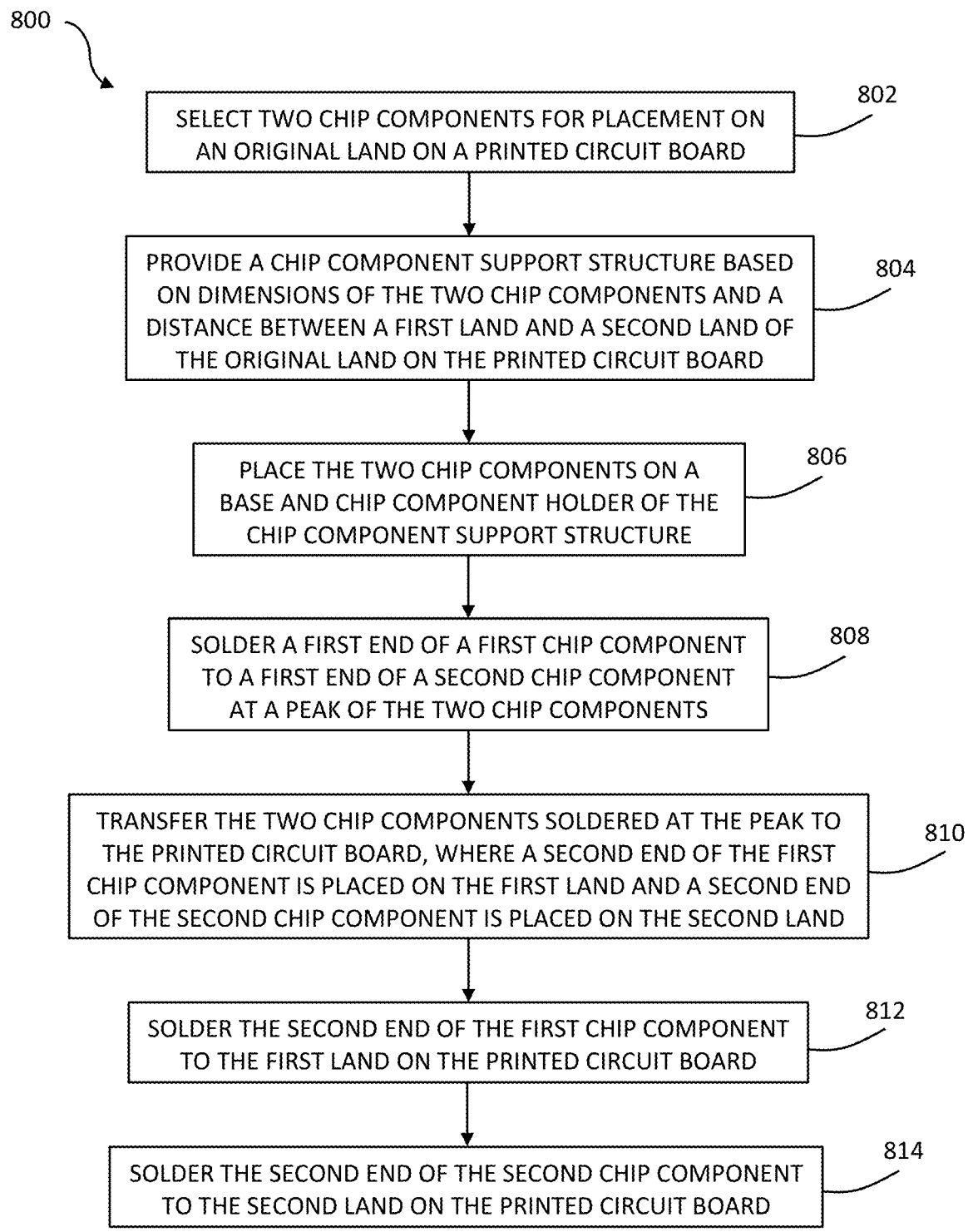
FIG. 8 depicts a process for a printed circuit board design rework with two chip components in series utilizing an original land location on a printed circuit board, in accordance with an embodiment of the present invention.

FIG. 8 depicts a process for a printed circuit board design rework with two chip components in series utilizing an original land location on a printed circuit board, in accordance with an embodiment of the present invention. Chip component rework process 800 represents a printed circuit board design rework process with two chip components in series utilizing an original land location on a printed circuit board. Chip component rework process 800 includes selecting two chip components for placement on an original land on a printed circuit board (802). The original land on the printed circuit board included an original chip component for which a circuit design rework is required. In one example, the original chip component is a resistor that does not provide a required resistance of at 2X ohms, where the original chip component provides only X ohms of resistance. Based on a distance between the first land and the second land on the printed circuit board, replacing the original chip component with X ohm resistance with another chip component with 2X ohm resistance is not possible due to the larger dimensions of the other chip component with 2X ohm resistance exceeding the dimensions of the original land. However, utilizing the two chip components in series in a standing triangular orientation allows for the 2X ohm resistance required for the circuit, while remaining in the bounds of the original land location on the printed circuit board. In another example, the original chip component is a capacitor that provides an excess of capacitance and lower voltage than what is required for the circuit, where the original chip component provides 2X micro-Farads of capacitance. Based on a distance between the first land and second land on the printed circuit board, replacing the original chip component with 2X micro-Farads of capacitance with another chip component with X micro-Farads of capacitance is not possible due to the dimensions of the other chip component with X micro-Farads. However, utilizing the two chip components in series in a standing triangular orientation allows for the X micro-Farads of capacitance required for the circuit, while remaining in the bounds of the original land location on printed circuit board 106.

Chip component rework process 800 includes providing a chip component support structure based on the dimensions of the two chip components and a distance between a first land and second land of the original land on the print circuit board (804). Dimensions of a base and a chip component holder of the chip component support structure are based on a distance between the first land and the second land of the original land location, since the two chip components are to utilize a first land and a second land of the original land previously utilized by the original chip component. Furthermore, dimensions of a base and a chip component holder of the chip component support structure are based a first set and a second set of dimensions corresponding to the two chip components required for the circuit design rework. Ideally, the two chip components would be of the same or similar dimensions to ensure a stable triangular orientation between the two chip components and the original land on the printed circuit board.

Chip component rework process 800 includes placing the two chip components on a base and chip component holder of the chip component support structure (806) and soldering a first end of a first chip component to a first end of a second chip component at a peak of the two chip components (808). A first chip component is electrically and mechanically coupled to the second chip component via a solder joint at the peak of the two chip components. The solder joint provides enough structural integrate to the two chip components in series to allow for the transfer from the chip component support structure to the original land on the printed circuit board. Chip component rework process 800 includes transferring the two chip components soldered at the peak to the printed circuit board, where a second end of the first chip component is placed on the first land and a second end of the second chip component is placed on the second land (810). Chip component rework process 800 includes soldering the second end of the first chip component to the first land on the printed circuit board (812) and soldering the second end of the second chip component to the second land on the printed circuit board (814).

In another embodiment, a chip component support structure for the two chip components can be avoid by manual supporting the two chip components during the soldering process. For example, an alternative process includes selecting two chip components for placement on an original land on a printed circuit board and applying solder to a first land from an original land location on the printed circuit board, while holding a first chip component at a designated angle for attachment to the first land. The alternative process further includes applying solder to a second land from the original land on the printed circuit board, while holding a second chip component at another designated angle for attachment to the second land. The alternative process further includes applying solder to a peak formed by the first chip component and the second chip component, where a solder joint is formed at the peak of the two chip components. The two chip components form a series between the first land and the second land on the original land location on the printed circuit board.

It is to be noted, that placing two chip components that are capacitors in series between the first land and the second land on the original land location on the printed circuit board allows for tighter tolerance capacitors. For example, a first capacitor has a capacitance of 5.4 micro-Farads with a tolerance of +/−1% (i.e., 0.054 micro-Farads) and a second capacitor has a capacitance of 5.4 micro-Farads with a tolerance of +/−1% (i.e., 0.054 micro-Farads). Utilizing the 3-sigma process, the first capacitor and the second capacitor each includes a standard deviation of 0.018 but with the first capacitor placed in series with the second capacitor, the total capacitance of 2.7 includes a standard deviation of 0.0063. The standard deviation of 0.0063 is reduced by 2.8 times when placing the first capacitor and the second capacitor in series on the original land on the printed circuit board. Table A below highlights the tighter tolerance capacitances between the two capacitors in series:

TABLE A

Tolerances between two capacitors in series on a single land

| Capacitor | Value | 3-Sigma Process |
|---|---|---|
| First Capacitor | 5.4 +/− 1% = 5.4 +/− 0.054 | 5.4 with Standard Deviation of 0.018 |
| Second Capacitor | 5.4 +/− 1% = 5.4 +/− 0.054 | 5.4 with Standard Deviation of 0.018 |
| Capacitors in Series | 2.7 | 2.7 with Standard Deviation of 0.0063 |

The terminology used herein is for the purpose of describing particular embodiments only and is not intended to be limiting to the invention. As used herein, the singular forms "a", "an" and "the" are intended to include the plural forms as well, unless the context clearly indicates otherwise.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A method comprising:
   selecting a first chip component and a second chip component for placement on an original land location previously occupied by an original chip component;
   placing the first chip component and the second chip component on a chip component support structure;
   soldering a first end of the first chip component to a first end of the second chip component;
   responsive to transferring the first chip component and the second chip component to the original land location, soldering a second end of the first chip component to a first land of the original land location; and
   soldering a second end of the second chip component to a second land of the original land location, wherein the first chip component, the second chip component, and the original land location, are in a triangular orientation.

2. The method of claim 1, further comprising:
   providing the chip component support structure, wherein the chip component support structure includes a base and a chip component holder for placement of the first chip component and the second chip component.

3. The method of claim 2, wherein the chip component support structure is based on a first set of dimensions for the first chip component and a second set of dimensions for the second chip component.

4. The method of claim 2, wherein the chip component support structure is further based on a distance between the first land and the second land of the original land location.

5. The method of claim 1, further comprising:
   transferring the first chip component solder to the second chip component, wherein the second end of the first chip component is placed on the first land and the second end of the second chip component is placed on the second land.

6. The method of claim 1, wherein a first solder between the first end of the first chip component and the first end of the second chip component has a greater melting point than a second solder between the second end of the first chip component and the first land.

7. The method of claim 6, wherein the first solder between the first end of the first chip component and the first end of the second chip component has a greater melting point than a third solder between the second end of the second chip component and the second land.

8. The method of claim 7, wherein the second solder and the third solder have the same melting point.

9. The method of claim 1, wherein the first chip component and the second chip components are resistors.

10. The method of claim 1, wherein the first chip component and the second chip components are capacitors.

11. A method comprising:
selecting a first chip component and a second chip component for placement on an original land location previously occupied by an original chip component;
responsive to holding the first chip component at a first designated angle at a first land of the original land location, soldering the first chip component to the first land;
responsive to holding the second chip component at a second designated angle at a second land of the original land location, soldering the second chip component to the second land; and
soldering the first chip component to the second chip component at a peak formed by the first chip component and the second chip component at the original land location.

12. The method of claim 11, wherein soldering the first chip component to the first land further comprises:
soldering a first end of the first chip component to the first land.

13. The method of claim 12, wherein soldering the second chip component to the second land further comprises:
soldering a first end of the second chip component to the second land.

14. The method of claim 13, wherein soldering the first chip component to the second chip component further comprises:
soldering a second end of the first chip component to a second end of the second chip component.

15. The method of claim 14, wherein a first solder between the second end of the first chip component and the second end of the second chip component has a greater melting point than a second solder between the first end of the first chip component and the first land.

16. The method of claim 15, wherein the first solder between the second end of the first chip component and the second end of the second chip component has a greater melting point than a third solder between the first end of the second chip component and the second land.

17. The method of claim 16, wherein the second solder and the third solder have the same melting point.

* * * * *